United States Patent [19]

Bormann

[11] 4,011,549
[45] Mar. 8, 1977

[54] SELECT LINE HOLD DOWN CIRCUIT FOR MOS MEMORY DECODER

[75] Inventor: Alan Richard Bormann, Tempe, Ariz.

[73] Assignee: Motorola, Inc., Chicago, Ill.

[22] Filed: Sept. 2, 1975

[21] Appl. No.: 609,855

[52] U.S. Cl. .......................... 340/173 CA; 307/205; 340/173 R
[51] Int. Cl.² ......................................... G11C 11/44
[58] Field of Search ............... 340/173 R, 173 CA; 307/205, 251, 279, 238, 303–304

[56] References Cited
UNITED STATES PATENTS

| | | | |
|---|---|---|---|
| 3,500,062 | 3/1970 | Annis | 307/205 |
| 3,747,076 | 7/1973 | Martino, Jr. | 340/173 CA |
| 3,876,993 | 4/1975 | Cavanaugh | 340/173 CA |

*Primary Examiner*—Marshall M. Curtis
*Attorney, Agent, or Firm*—Charles R. Hoffman

[57] ABSTRACT

A decoder for a semiconductor MOS random access memory includes a dynamic NOR gate having a first output. The decoder also includes a selection MOSFET for providing a selection signal to a selection conductor connected to a row or column of an array of storage cells of said random access memory. The gate electrode of the selection MOSFET is connected to the output node of the NOR gate. The drain of the selection MOSFET is connected to a signal conductor adapted to having a signal applied thereto which is a function of a read/write signal applied to said random access memory. The source of the selection MOSFET is connected to the selection conductor. A feedback MOSFET is coupled between the output of the dynamic NOR gate and the selection conductor and has its gate electrode controlled by the signal which is a function of the read/write input signal. When the NOR gate is selected by a particular combination of address input variables, its initially precharged output node is discharged to ground. The feedback MOSFET discharges the selection conductor to ground through the feedback MOSFET and the combination of input MOSFETs of the NOR gate which previously discharged the output node thereof. The discharge of the selection conductor occurs when the read selection signal is applied to the gate of the feedback MOSFET.

6 Claims, 3 Drawing Figures

SELECT LINE HOLD DOWN CIRCUIT FOR MOS MEMORY DECODER

BACKGROUND OF THE INVENTION

1. Field of the Invention

The invention relates to decoder circuits, and more particularly to MOSFET decoder circuits for semiconductor random access memory devices.

2. Description of the Prior Art

Integrated circuit semiconductor random access memories have been implemented utilizing MOSFETs (also commonly called IGFETs). Such random access memories (RAMs) typically include a relatively large array of storage cells and decoding circuitry which selects one row and one column so that the particular storage cell located at the intersection of the selected row and selected column is accessed so that its contents can be modified during a write cycle or its contents can be sensed during a read cycle. To accomplish this type of row and column selection, row and column decoders are utilized. Such decoders are typically implemented utilizing dynamic NOR gates each having an IGFET which initially precharges the output of the respective NOR gate. Address input buffers then provide signals to the inputs of the NOR gates which are decoded by the NOR gates. The address buffer outputs are connected to the NOR gate inputs so that each unique combination of binary address inputs selects one and only one decode gate. None of the switching IGFETs for the selected row decode gate and column decode gate are turned on, but at one or more switching IGFETs for all of the unselected code gates are turned on. Column selection circuitry or row selection circuitry is connected to the output of each NOR gate. The output, of the column or row selection circuitry are called column select lines and row select lines and are coupled to each of the cells in the respective rows or columns. Since only one row and one column can be selected during a particular memory cycle, it is imperative that all unselected select lines be maintained at a logical "0". This is frequently accomplished by utilizing discharge circuitry coupled to each select line for both rows and columns, which discharge circuitry discharges all select lines to ground voltage at the same time that the NOR gate load MOSFETs precharge all of the NOR gate outputs to a positive voltage in an N-channel memory circuit. However, this approach suffers from the disadvantage that such discharge circuitry typically requires additional power dissipation and chip area.

SUMMARY OF THE INVENTION

It is an object of this invention to provide a dynamic MOS decoder with circuitry which maintains unselected select lines at a predetermined voltage and requires less semiconductor chip area, lower logical complexity than known select line hold-down circuits.

It is another object of this invention to provide a circuit which holds down unselected select lines of a dynamic MOS decoder which does not require precharging the unselected select lines to a predetermined voltage.

Briefly described, the invention is a dynamic decoder circuit which includes a logic gate circuit and a selection circuit driving a select line. A feedback circuit coupled between the select line and the output of the logic gate is provided to discharge the select line to a predetermined voltage in response to a control signal. In one embodiment of the invention a decoder includes a plurality of such IGFET logic gates and a plurality of selection circuits each coupled to the output of one of the logic gates, respectively. Each of the selection circuits includes a feedback circuit responsive to an internally generated control signal to discharge an unselected select line through switching devices of each of unselected logic gates.

DESCRIPTION OF THE INVENTION

Figure 1A:
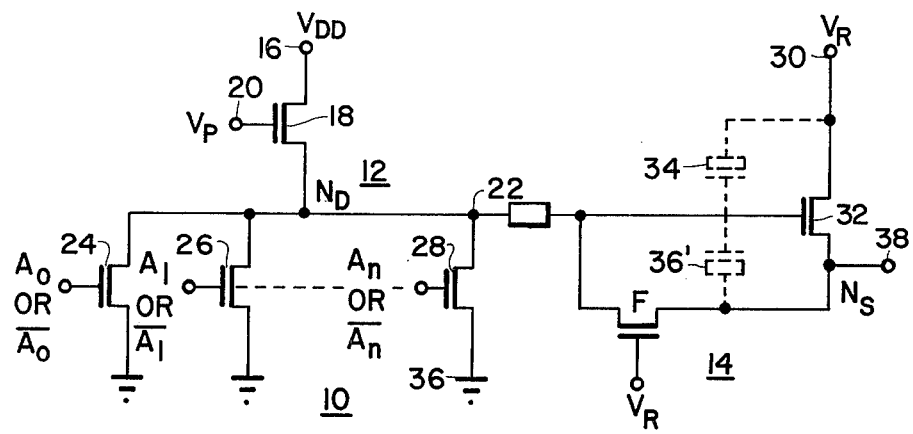
FIG. 1A is a partial schematic diagram of a decoder circuit according to the invention.

Referring to the schematic diagram of FIG. 1A, it is seen that decode circuit 10 includes dynamic NOR gate 12 and selection circuit 14. NOR gate 12 includes load IGFET 18 having its drain connected to $V_{DD}$, node 16 and its source connected to node 22, designated $N_D$ and has its gate electrode connected to clock conductor 20 which has a precharge signal $V_P$ applied thereto. NOR gate 12 also includes a plurality of switching IGFETs, including 24, 26, and 28, each having their drain connected to node 22 and their source connected to ground conductor 36, and each having their gate connected to an input node which has a binary logic signal applied thereto for purposes of selecting NOR gate 12.

Those skilled in the art will recognize that MOSFETs (metal oxide semiconductor field effect transistors), as implemented in typical integrated circuits, are bilateral devices, having a gate and a source and a drain. However, the source and drain are functionally interchangeable, and both in the description and in the claims herein, the terms are utilized merely to indicate interconnections, rather than function of a particular MOSFET terminal. For example, the terminal of a MOSFET which functions as a drain for one part of the circuit operation may function as a source for another part of the circuit operation. For a more complete description of the operation and physics of MOSFETs, see "Physics and Technology of Semiconductor Devices:", by A. S. Grove, John Wiley & Sons, Inc., 1967. Those skilled in the art will also recognize that the acronym MOSFET is commonly used synonymously with the term IGFET (insulated gate field effect transistor), even though the gate may be polycrystalline silicon or some other conductive material rather than metal.

NOR gate 12 is said to be selected when all of the switching devices 24, 26, 28, etc. are in the off condition, so that node 22 remains at a logical "1" level, which is close to $V_{DD}$ volts when node 22 has been initially precharged by a pulse of precharge signal $V_P$. Incidentally, the IGFETs (insulated gate field effect transistor) in FIG. 1A may be N channel or P channel. However, in the description of the operation of decode circuit 10, which is set forth with reference to the timing diagram of FIG. 2, it is assumed that all of the IGFETs are of the N channel variety. Selection circuit 14 includes IGFET 32, which has its drain connected to node 30, which has a signal $V_R$ applied thereto. IGFET 32 has its source connected to select conductor 38, which, as explained hereinafter with reference to FIG.

1B, serves to select either a row or a column of memory cells in a presently preferred embodiment of the invention. The gate electrode of IGFET 32 is connected to node 22. Bootstrap capacitors 34 and 36 may optionally be connected between the gate and drain and gate and source, respectively, of IGFET 32. Feedback MOSFET 34 has its source connected to node 22 and its drain connected to select conductor 38 and has its gate electrode connected to $V_R$ conductor 30.

Figure 1B:
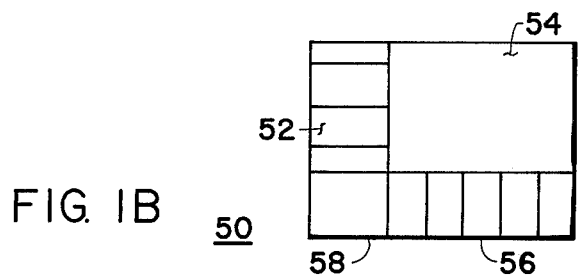
FIG. 1B is a block diagram of a semiconductor random access memory utilizing a plurality of the decode circuits of FIG. 1A.

FIG. 1B is a block diagram of an IGFET semiconductor random access memory chip 50. Semiconductor chip 50 includes an array 54 of storage cells arranged in rows and columns. Decode circuitry 52 selects one row of storage array 54 by providing a logical "1" signal on a selection conductor coupled to each of the storage cells in the selected row. The configuration of the binary address inputs (not shown) determines which row is selected. Similarly, decode circuitry 56 selects one of the columns of storage array 54 by selecting one column selection conductor connected to each of the memory cells in the selected column. All unselected row selection conductors must be kept at a logical "0". Similarly, all unselected column selection conductors must be kept at a logical "0" to avoid coincident row and column selection of more than one memory cell as this would result in destruction of stored data.

Decode circuit 52 includes a plurality of decode circuits 10, one for each row in memory array 54. Similarly, decode circuitry 56 may also include a plurality of decode circuits which may be identical to or similar to decode circuit 10. All of the row decode NOR gates have their inputs connected to various combinations of row address and address complement variables generated by row address buffers (not shown) included in section 58 of chip 50. Similarly, the NOR gates in section 56 all have their inputs connected to the outputs of the column address buffers (not shown) in section 58, which generate the internal address and address complement signals which are connected in the various possible binary combinations to the inputs of the column NOR decode gates.

Figure 2:
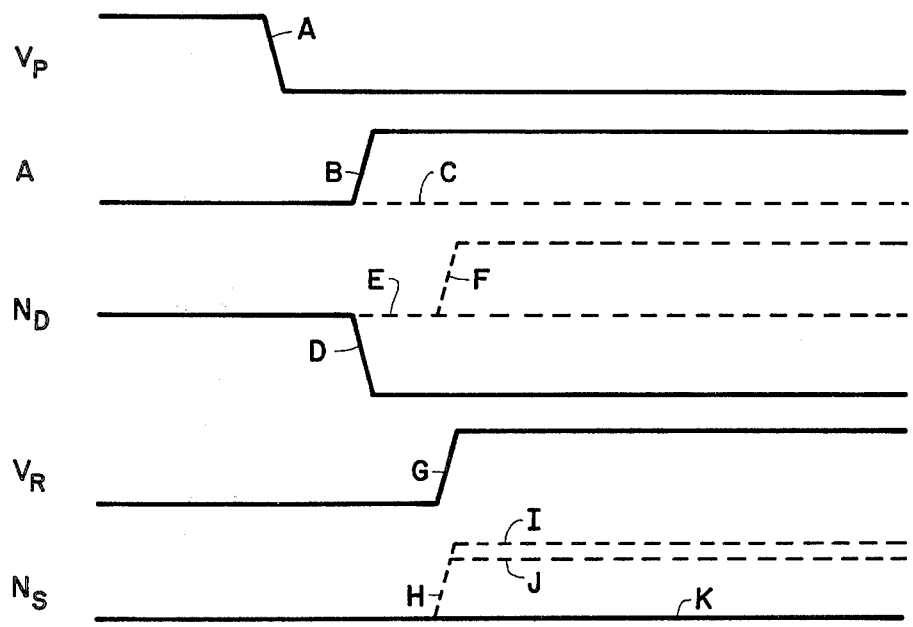
FIG. 2 is a timing diagram useful in describing the operation of the embodiment of the invention shown in FIG. 1A.

The operation of the embodiment of the invention shown in FIGS. 1A and 1B is best described with reference to the timing diagram of FIG. 2. It is initially assumed that the precharge signal $V_P$ is in a logical "1" state. Then MOSFET 18 is in an "on" condition and node 22 is held at approximately $V_{DD}$ volts, i.e., at a logical "1". The first event that occurs is that $V_P$ undergoes transition A to a logical "0", which is zero volts in this case. This turns IGFET 18 off, but node 22 remains at approximately $V_{DD}$ volts due to charge stored on capacitance associated with node 22. If NOR gate 12 is unselected, then at least one of the switching IGFETs 24, 26, 28, etc. is turned on as one of the address or address complement inputs A0, A1, etc. is turned on. Any one of the address or address complements may be represented by waveform A in FIG. 2, and the corresponding switching IGFET is turned on when waveform A undergoes transition B. This causes node 22, represented in FIG. 2 by waveform $N_D$ to undergo transition D to a logical "0" level from the initial logical "1" level. However, if NOR gate 12 is selected, then all of the address inputs A0, A1, etc. remain at zero volts and none of the switching IGFETs 24, 26, etc. is turned on. This condition corresponds to dotted line C of waveform A. Then, in the absence of bootstrap capacitors 34 and 36, $N_D$ remains at level E, indicated by the dotted line. If one or both of bootstrap capacitors 34 or 36 are connected as shown in FIG. 1A, then waveform $N_D$ undergoes transition F if NOR gate 12 is selected. This occurs because $V_R$ undergoes transition G, which capacitively boosts node 22 to a more positive voltage, further, since selection IGFET 32 is on, select conductor 38, represented by waveform $N_S$ also goes positive during transition H, and further boosting of node 22 by means of bootstrap capacitor 36 also occurs. Level J of waveform $N_S$ is the voltage to which node 38 is driven in the absence of optional bootstrap capacitors 34 and 36 when NOR gate 12 is selected. Level I is the selected voltage level to which node 38 is driven if the bootstrap capacitors 34 and 36' are provided. Level K is the ground voltage at which node 38 remains if NOR gate 12 is unselected, so that one of input devices 24, 26, 28, etc. is on, so that node 22 is discharged; in this case, when $V_R$ goes positive at transition G, feedback MOSFET 34 is turned on, and select IGFET 32 is turned off by the discharge of node 22 if $V_R$ goes positive. Any positive voltage on node 38 is then discharged to ground voltage through feedback MOSFET 34 and whatever combination of input IGFETS 24, 26, 28, etc. are in the on condition.

In summary, provision of feedback IGFET 34 between select line 38 and NOR gate output node 22 provides an improved method of insuring that select line 38 is discharged to ground voltage during an unselected memory cycle.

What is claimed is:

1. In a memory system, an address decode circuit comprising:
 a gate circuit means having an output node and a plurality of binary inputs thereto for producing at said output node a logical "1" voltage level in response to a particular combination of said binary inputs and a logical "0" voltage level thereat when another combination of said binary inputs occurs;
 a second circuit means having an input coupled to said output node and an output conductor for producing a logical "1" voltage level at said output conductor in response to a control input coupled to said second circuit when said particular combination of said binary inputs occurs; and
 circuit means coupled between said output conductor and said output node for causing a logical "0" voltage level to appear at said output conductor when said other combination of said binary inputs causes a logical "0" voltage level to appear at said output node.

2. In a memory system, an address decode circuit comprising:
 a dynamic NOR gate having a plurality of binary inputs thereto and an output node;
 a first electron control device having first and second electrodes and a control electrode, said control electrode being coupled to said output node, said first electrode being connected to a control input, and said second electrode being connected to an output conductor; and
 a second electron control device having first and second electrodes and a control electrode, said first electrode thereof being coupled to said output node of said NOR gate and said second electrode of said second electron control device being connected to said output conductor, and said control electrode of said second electron control device being coupled to control input conductor.

3. The address decode circuit as recited in claim 2 wherein said NOR gate is a dynamic IGFET NOR gate including a load IGFET coupled between a first voltage supply conductor and a first node and having its gate electrode coupled to a precharge clock signal conductor and including further a plurality of switch IGFETs coupled between said first node and a second voltage supply conductor, each of said switch IGFETs having its respective gate connected to binary input signal conductor;
- a selection circuit including a driver IGFET coupled between a control signal conductor and an output conductor and having its gate electrode coupled to said first node; and
- a feedback IGFET coupled between said output conductor and said first node and having its gate electrode coupled to a second clock signal conductor.

4. The address decode circuit as recited in claim 3 wherein said gate of said feedback IGFET and said first clock signal conductors are coupled together.

5. The address decode circuit as recited in claim 3 further including a capacitor coupled between said source and said gate of said driver MOSFET and a second bootstrap capacitor connected between said gate and said source of said driver MOSFET.

6. A random access memory semiconductor chip including a plurality of address inputs and decoder circuitry including a plurality of address buffer circuits coupled, respectively, to said address inputs for generating address signals and address complement signals comprising:
- a plurality of dynamic NOR decode gates each having an output node and each having a plurality of inputs, each of said inputs coupled to one of said address or address complement signals such that there are two to the $2^N$ unique combinations of address and address complement conductors coupled to said dynamic NOR gates;
- a plurality of selection circuits each coupled, respectively, to one of said NOR gate output nodes, each of said selection circuits being coupled to an output conductor for generating a selection signal thereon when the NOR gate connected to said selection circuit as decoded in response to a control signal;
- each of said selection circuits further including feedback circuit means responsive to said control signal coupled between sid output node of said selection circuit and said output node of said dynamic NOR gate for causing a logical "0" to appear at said output node when said NOR gate is not addressed.

* * * * *